United States Patent [19]
Bachman

[11] Patent Number: 5,590,532
[45] Date of Patent: Jan. 7, 1997

[54] SOLID STATE LIQUID TEMPERATURE PROCESSOR

[75] Inventor: Wesley J. Bachman, Auburn, Ill.

[73] Assignee: Bunn-O-Matic Corporation, Springfield, Ill.

[21] Appl. No.: 502,004

[22] Filed: Jul. 13, 1995

Related U.S. Application Data

[63] Continuation-in-part of Ser. No. 191,616, Feb. 4, 1994, abandoned.

[51] Int. Cl.$^6$ ............................. F25B 21/02; B67D 5/62
[52] U.S. Cl. ................... 62/3.3; 62/389; 62/3.64
[58] Field of Search ........................... 62/3.2, 3.3, 3.62, 62/3.64, 3.7, 389

[56] References Cited

U.S. PATENT DOCUMENTS

| | | | |
|---|---|---|---|
| 2,928,253 | 3/1960 | Lopp et al. | 62/3.3 |
| 3,139,734 | 7/1964 | Kuckens et al. | 62/3.3 |
| 3,250,433 | 5/1966 | Christine et al. | 62/389 |
| 4,829,771 | 5/1989 | Koslow et al. | 62/3.64 |
| 5,154,661 | 10/1992 | Higgins | 62/3.2 |
| 5,493,864 | 2/1996 | Pomerene et al. | 62/3.7 |

*Primary Examiner*—William Doerrler
*Attorney, Agent, or Firm*—Trexler, Bushnell, Giangiorgi & Blackstone, Ltd.

[57] ABSTRACT

The present invention envisions a water temperature processing system for reducing the temperature of water to a temperature of as low as 35 degrees fahrenheit. The present invention also envisions a water heating system as an element of the water temperature processing system for elevating the temperature of water to a temperature of 80–210 degrees fahrenheit. The water temperature processing system includes a warm water flow path and a cool water flow path. A warm water pump and a cool water pump are operatively associated with the respective warm water and cool water flow paths to move the water through the respective flow paths. The cool water flow path includes at least one outlet for dispensing water from the cooling system. The system includes at least one warm water and one cool water heat transfer section which communicates with the warm water and the cool water flow paths, respectively. Peltier heat transfer devices are positioned between the warm water and the cool water heat transfer sections. Operation of the Peltier device results in transference of energy from one water flow path to the other water flow path. Heat energy accumulated by the one of the water flow paths is dissipated or collected by the other of the flow paths.

14 Claims, 5 Drawing Sheets

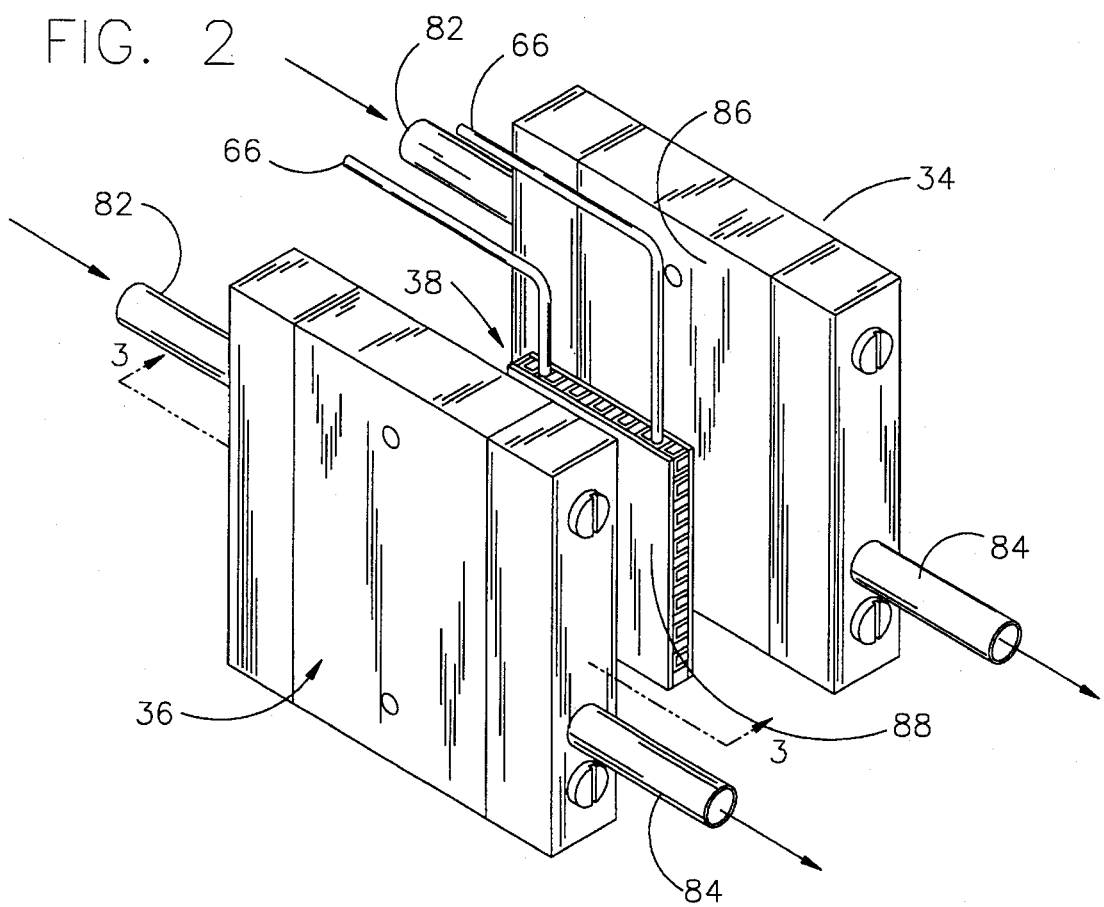
FIG. 2
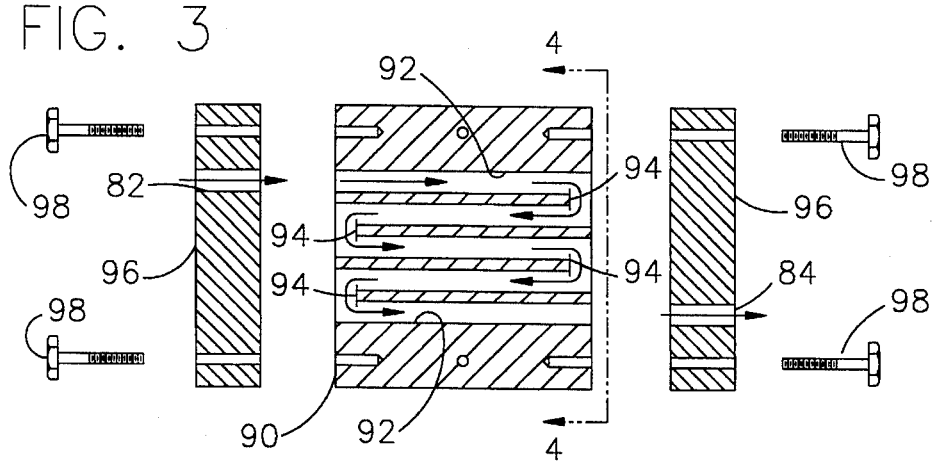
FIG. 3
FIG. 4

# 5,590,532

SOLID STATE LIQUID TEMPERATURE PROCESSOR

CROSS-REFERENCE

This is a continuation-in-part of U.S. patent application Ser. No. 08/191,616 filed Feb. 4, 1994, now abandoned.

BACKGROUND

The present invention relates to a novel water cooling system which utilizes Peltier technology to change the temperature of potable water to a desired temperature.

A variety of devices are available to cool or heat water for drinking and food preparation purposes. When cooling water, drinking water coolers use a refrigeration unit which include a compressor employing refrigerant gas. The prior art water coolers require considerable space in order to accommodate the compressor and a condenser. The compressor in a prior art water cooler may become damaged or work inefficiently such that it generates a vibration and creates a rattling noise against the structure of the water cooler.

Another problem with prior art water coolers is the refrigeration unit uses a refrigerant gas to provide a desired cooling effect. Refrigerant gases may be detrimental to the environment and thus it is desirable to eliminate such refrigerant gases. Additionally, since these gases may be detrimental to the environment the federal government has instituted guidelines to regulate the use of such gases. These guidelines or regulations will may eventually require the capture and recycling of refrigerants removed from water coolers and other related devices. Further, prior art water coolers are difficult to service such that special precautions must be taken to assure compliance with the regulations and prevent the escape of refrigerants.

As can be understood from the problems described hereinabove, there is a need for a water cooling system which cools water without using refrigerant gases.

When heating water for such uses as producing brewed beverages and food preparation, a variety of heating devices are available which raise a quantity of water to a desired heated temperature close to boiling. Such water heating devices typically use an electrical heating element which is submerged in a reservoir tank for elevating the temperature of the water retained therein to a desired temperature. A problem with this type of heating device is that the heating device can only be used to heat water and cannot be used to cool water. As can be understood from the problems described herein, there is a need for a water processing system which heats as well as cools water.

OBJECTS AND SUMMARY

A general object of the present invention is to provide a water temperature processing system which can heat or cool water to a desired temperature.

A general object of the present invention is to provide a water cooling system which operates without refrigerant gases.

Another object of the present invention is to provide a solid state water cooling system to eliminate operational noises related to compressors as used in prior art water cooling systems.

Yet another object of the present invention is to provide a water cooling system which includes a control circuit to control operation of the system over prespecified operating parameters.

Briefly, and in accordance with the foregoing, the present invention envisions a water temperature processing system for reducing the temperature of water to a temperature of as low as 35 degrees fahrenheit. The present invention also envisions a water heating system as an element of the water temperature processing system for elevating the temperature of water to a temperature of 80°–210° degrees fahrenheit. The water temperature processing system includes a warm water flow path and a cool water flow path. A warm water pump and a cool water pump are operatively associated with the respective warm water and cool water flow paths to move the water through the respective flow paths. The cool water flow path includes at least one outlet for dispensing water from the cooling system. The system includes at least one warm water and one cool water heat transfer section which communicates with the warm water and the cool water flow paths, respectively. Peltier heat transfer devices are positioned between the warm water and the cool water heat transfer sections. Operation of the Peltier device results in transference of energy from one water flow path to the other water flow path. Heat energy accumulated by the one of the water flow paths is dissipated or collected by the other of the flow paths.

BRIEF DESCRIPTION OF THE DRAWINGS

The organization and manner of the structure and operation of the invention, together with further objects and advantages thereof, may be understood by reference to the following description taken in connection with the accompanying drawings, wherein like reference numerals identify like elements, and in which:

FIG. 2 is an exploded perspective view of a cool water heat transfer section and a warm water heat transfer section displaced from a Peltier device positioned therebetween;

FIG. 3 is an exploded cross-sectional view taken along line 3—3 in FIG. 2 through the cool water heat transfer section and in which end fittings have been displaced from a central tortuous path section;

FIG. 4 is an end view taken along line 4—4 in FIG. 3 of the tortuous path section;

DETAILED DESCRIPTION OF THE PREFERRED EMBODIMENT

Figure 1:
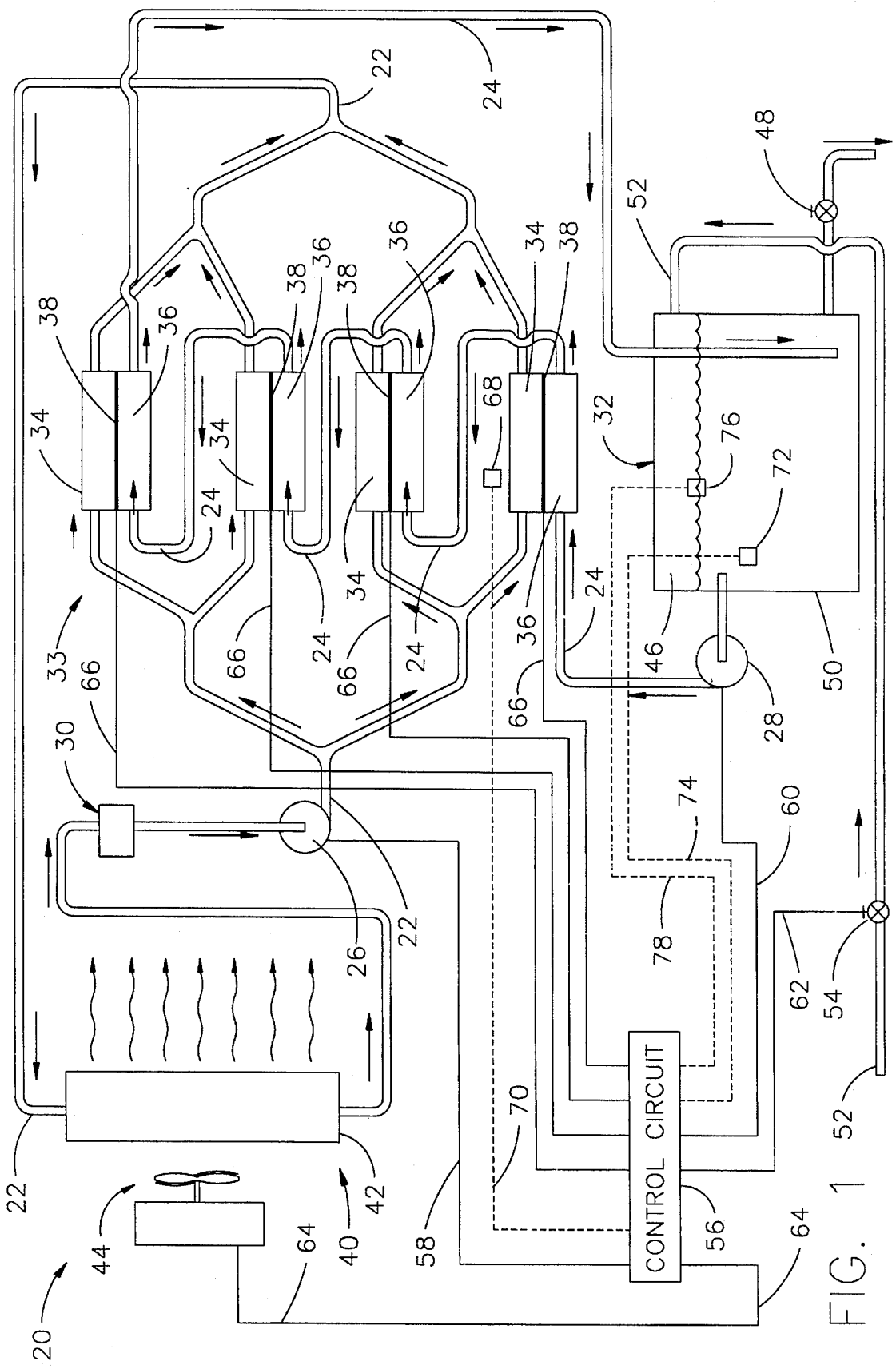
FIG. 1 is a generalized schematic of a water cooling system of the present invention.

While the invention may be susceptible to embodiment in different forms, there is shown in the drawings, and herein will be described in detail, embodiments with the understanding that the present description is to be considered an exemplification of the principles of the invention and is not intended to limit the invention to that as illustrated and described herein.

A water cooling system 20 is shown in FIG. 1. The water cooling system includes a first conduit 22 and second conduit 24. The first conduit 22 is disposed generally in a warm water flow path 23 and the second conduit 24 is disposed generally in a cool water flow path 25. A warm water pump 26 is disposed in and communicates with the warm water flow path 23 for moving water through the flow path 23. Similarly, a cool water pump 28 is disposed in and communicates with the cool water flow path 25 for moving water through the cool water flow path 25. Each flow path 23, 25 includes a corresponding warm water and cool water reservoir 30, 32. Water is moved from the respective reservoirs 30, 32 under the influence of the corresponding pumps 26, 28 through the respective flow paths 23, 25.

A heat transfer assembly 33 is provided including a plurality of warm water heat transfer sections 34 and cool water heat transfer sections 36 are placed in communication with the corresponding warm water and cool water paths 23, 25. The heat transfer sections 34, 36 are shown and discussed in greater detail in FIG. 2-4. Each of the warm water heat transfer sections 34 is placed in close proximity to a cool water heat transfer section 36. A thermoelectric Peltier device 38, of known construction such as is available from Melcor Corporation Trenton, N.J. is positioned between each of the pairs of warm water and cold water heat transfer sections 34, 36. The Peltier device "pumps" energy in the form of heat from the water passing through the cool water heat transfer section 36. Heat removed from the corresponding cool water heat transfer section 36 is transferred to the corresponding warm water heat transfer section 34 and transported from this section 34 via warm water flowing through the warm water flow path 23.

In practice, a thermal lubricant or "grease" may be spread between the abutting surfaces of the Peltier device 38 and the warm water heat transfer device, and the abutting surfaces of the Peltier device 38 and the cool water heat transfer section 36. Water is pumped from the warm water reservoir 30 by way of the pump 26 to and through the warm heat transfer sections 34. Similarly, water is pumped from the cool water reservoir by means of the pump 28 to and through the cool water heat transfer sections 36. In operation, the Peltier device 38 induces a directional heat transfer from the corresponding cool water heat transfer section 36 to the corresponding warm heat transfer section 34. Water exiting the warm water heat transfer section 34 will have an increased temperature compared to water entering the section 34 whereas water exiting from a cool water heat transfer section 36 will have a lower temperature compared to the water entering this section 36.

Radiating means 40 is provided to dissipate heat energy carried by the water in the warm water flow path 23. Radiating means 40 includes a radiator assembly 42 and cooling fan 44. As warm water exits the warm water heat transfer sections 34 it next passes through the radiator assembly 42 and heat energy carried thereby is dissipated by operation of the cooling fan 44. The radiator assembly 42 comprises a tortuous path to increase a surface area within a given volume.

The cool water flow path 25 moves water from an upper section 46 of the cool water reservoir 32. Drinking water is dispensed from the cool water reservoir 32 by way of an outlet 48 which communicates with a lower section 50 of the cool water reservoir 32. Refill water is introduced through a feed line 52 to top off the reservoir 32. A controllable valve 54 communicates with the feed line 52 for introducing a controlled volume of water into the upper level 46 of the cool water reservoir 32.

The water cooling system 20 is controlled by a control circuit 56, the details of which are discussed hereinbelow with reference to FIG. 5. The control circuit 56 is coupled to the warm water pump 26 over line 58, the cool water pump 28 over line 60, the controllable inlet valve 54 over line 62, the fan 44 over line 64, and each of the Peltier devices 38 over control lines 66. The system 20 also includes a transfer section temperature sensor 68 coupled to the control circuit 56 by line 70, a reservoir temperature sensor 72 coupled to the control circuit 56 over line 74, and a water level sensor 76 coupled to the control circuit 56 over line 78.

The sensors 68, 72, 76 operate within predetermined operating parameters such as a selected range of temperatures and water levels. For example, the transfer section temperature sensor 68 senses the temperature on a warm water heat transfer section 34 and transmits the temperature over line 70 to the control circuit 56. The sensed temperature is compared by the control circuit 56 to a selected temperature. When the temperature sensed by the transfer section temperature sensor 68 exceeds the selected temperature, the control circuit 56 suspends operation of the system. The selected temperature is set at a value which generally corresponds to a zero heat transfer condition. This prevents the system 20 from operating at extreme inefficiency. The zero heat transfer condition could be caused by failure of a pump or excessive room temperature in which the system operates.

The water level sensor 76 transmits the water level of the reservoir 32 over line 78 to the control circuit 56. When the water level in the reservoir 32 falls below a selected low level, control circuit 56 operates the valve 54 over line 62 to introduce additional water into the reservoir 32. As water flows through the feed line 52 into the cool water reservoir 32 the sensor 76 will sense the change in the water level and at a preset water level the control circuit 56 will operate the valve 54 to stop the inflow of water through the feed line 52.

The reservoir temperature sensor 72 senses the temperature of the water retained in the reservoir and transmits the temperature value over line 74 to the control circuit 56. When the temperature of the water in the reservoir 32 rises to a temperature above a selected value in the control circuit 56, the control circuit 56 activates the Peltier devices 38 over the control lines 66 and initiates operation of the pumps 26 and 28 over control lines 58, 60, respectively. Pumping water from the upper section 46 of the cool water reservoir 32 moves water through the cool water path 24 to remove heat energy therefrom. Water which returns to the cool water reservoir 32 enters the lower section 50 of the reservoir 32. Temperature differences between the water in the upper section 46 and the lower section 50 of the cool water reservoir 32 will result in warm water rising towards the upper section 46 and being pumped out of the reservoir by the pump 28.

It should be noted, that the pumps 26, 28 provide the necessary valving to control the flow of water through the warm water and cool water flow paths 23, 25. When the pumps 26, 28 operate water flows through the respective flow paths 23, 25. When the control circuit 56 suspends operation of the pumps 26, 28 water is not permitted to flow through the respective flow paths, 23, 25.

The present water cooling system 20, and the alternate embodiments 20a and 20b discussed in detail hereinbelow, maximize the heat transfer from the cool water heat transfer sections 36 to the warm water heat transfer section 34. In the first embodiment shown in FIG. 1 heat transfer is maximized is by placing the warm water heat transfer sections 34 in parallel communication in the warm water flow path 22. The cool water heat transfer sections are placed in series communication with the cool water flow path 24. The water flowing through the cool water flow path is progressively cooled as it passes through the series of cool water heat transfer sections 36. In contrast, the water flowing through the warm water flow path 22 passes through only one heat transfer section before it is returned to the radiator means 40.

With reference to FIGS. 2–4, the heat transfer sections 34, 36 are constructed with a twisting section of conduit 80 defining a tortuous path. As shown in FIG. 2, an entry port 82 is connected to an upper portion of each of the heat transfer sections and an exit port 84 is connected to a lower portion of the respective heat transfer sections. With reference to FIGS. 3 and 4, the entry port 82 communicates with the tortuous path 80 at one end and the exit port 84 at the opposite end. The Peltier device 38 is placed in abutting contact with facing surfaces 86 of the heat transfer sections 34, 36. A layer of heat transfer lubricant or "grease" is placed on the facing surfaces and the abutting surfaces 88 of the Peltier device. As such, the Peltier device 38 is sandwiched between corresponding warm water and cool water heat transfer sections 34, 36 with a very thin layer of heat transfer lubricant between abutting surfaces 86, 88 of the heat transfer sections 34, 36 and the Peltier device 38.

The heat transfer sections 34, 36 are constructed from a block of thermally conductive material, such as aluminum. A central portion 90 is formed with a series of generally parallel channels or bores 92 formed therethrough. Neighboring pairs of bores 92 are alternately joined by a recess 94. End blocks 96 are formed with a respective entry port 82 or exit port 84. The end blocks 96 are positioned against the central portion 90 and attached thereto with appropriate fasteners 98. When the end blocks 96 are attached to the central portion, a unitary tortuous channel or path 80 is defined extending through the heat transfer section 34, 36.

Figure 5:
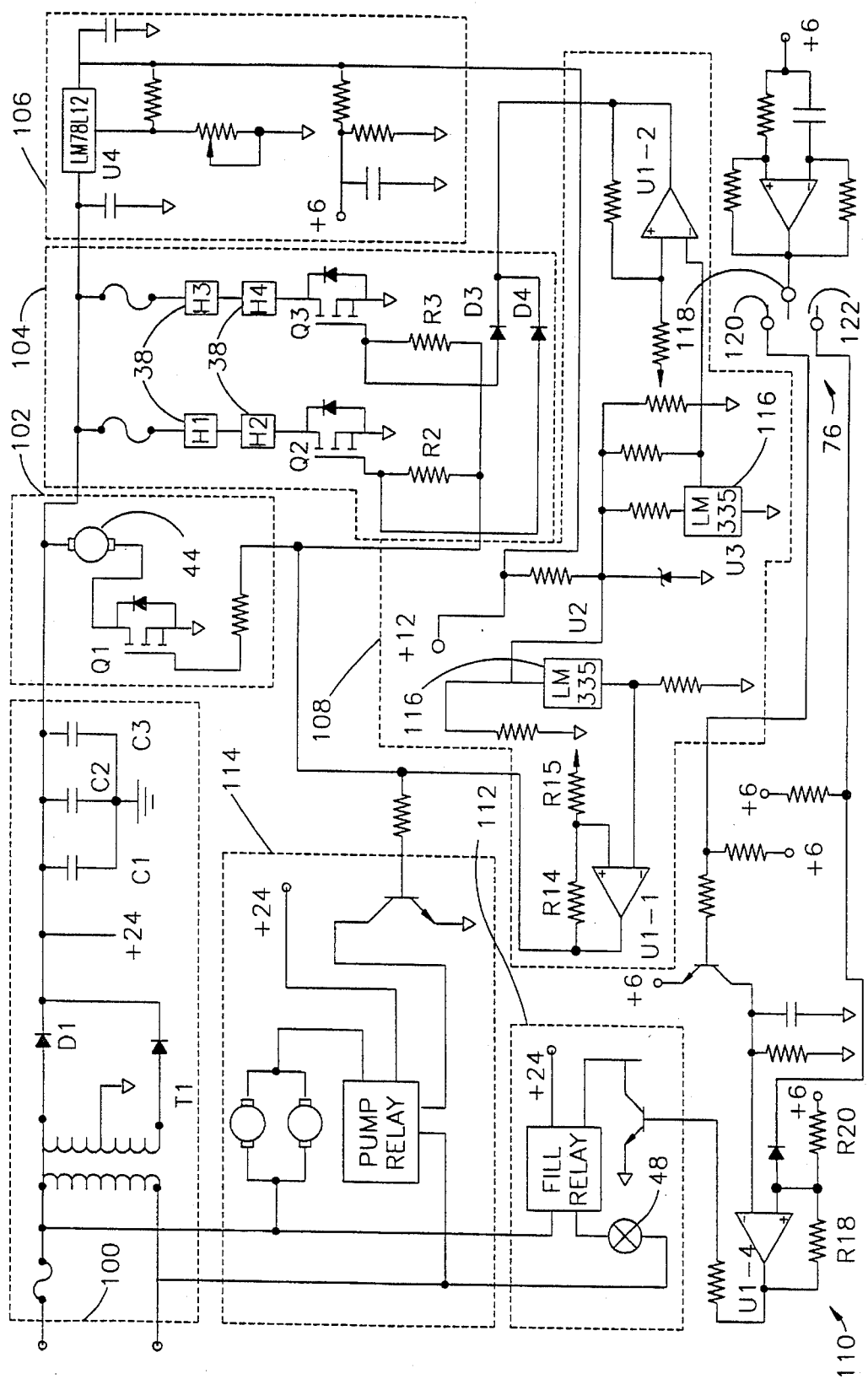
FIG. 5 is an electrical schematic of the water cooling system of the present invention.
Figure 6:
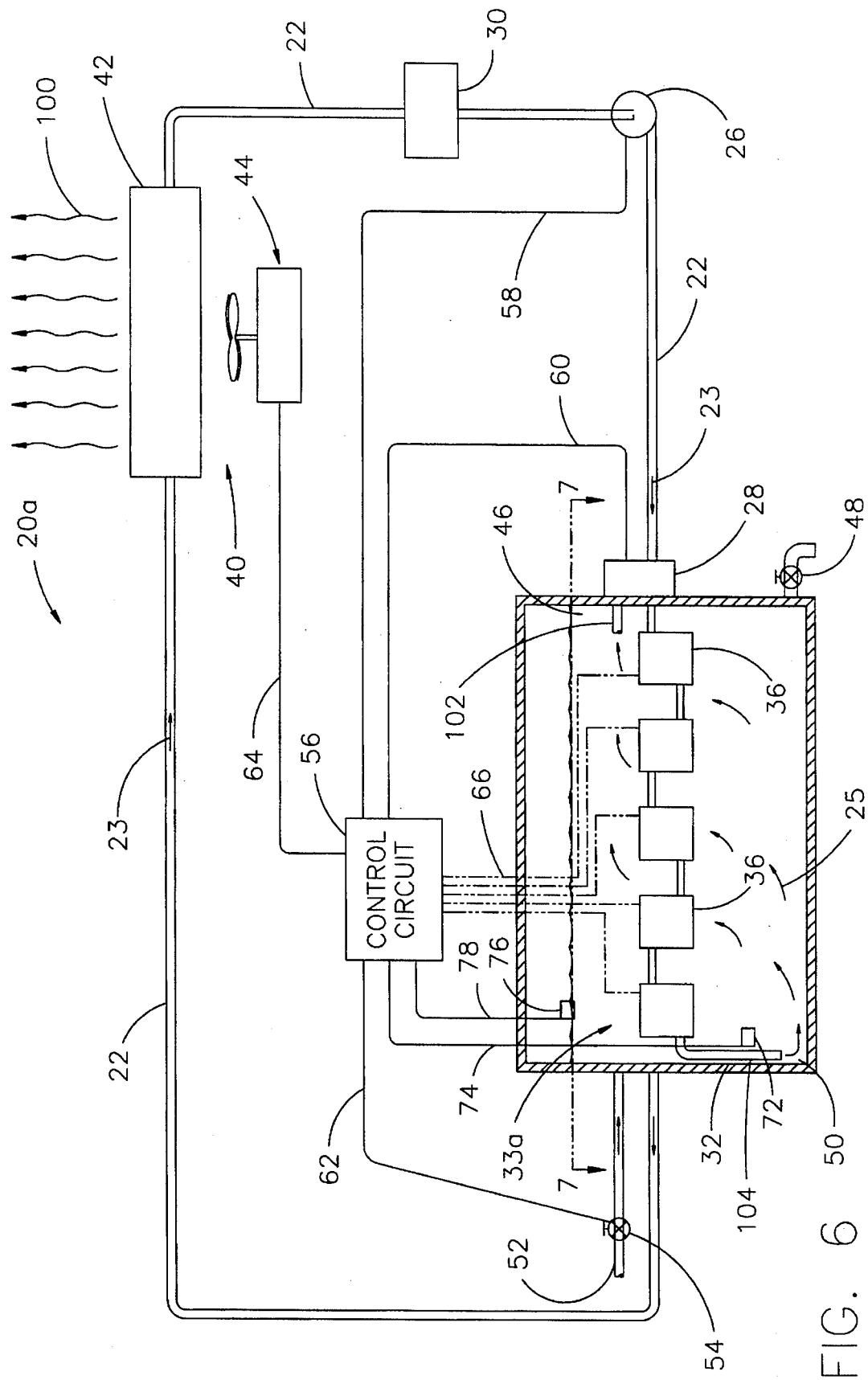
FIG. 6 is a generalized schematic of an alternate embodiment of a water cooling system of the present invention.

FIGS. 6, 7 and 8, 9 show additional forms of the water cooling system. These embodiments refer to elements which are identical to the embodiments as shown in FIGS. 1–5 using the same reference numerals and variations in such elements or new elements which be referred by the additional of an alphabetic suffix. For example, the water cooling system 20 as shown in FIG. 1 is referred to as 20a in FIGS. 6 and 7 and 20b in FIGS. 8 and 9. It should also be understood that the system 20a as shown in FIG. 6 is the same system as employed in FIG. 8 except for the changes in the reservoir and heat exchanging components as described hereinbelow.

Figure 7:
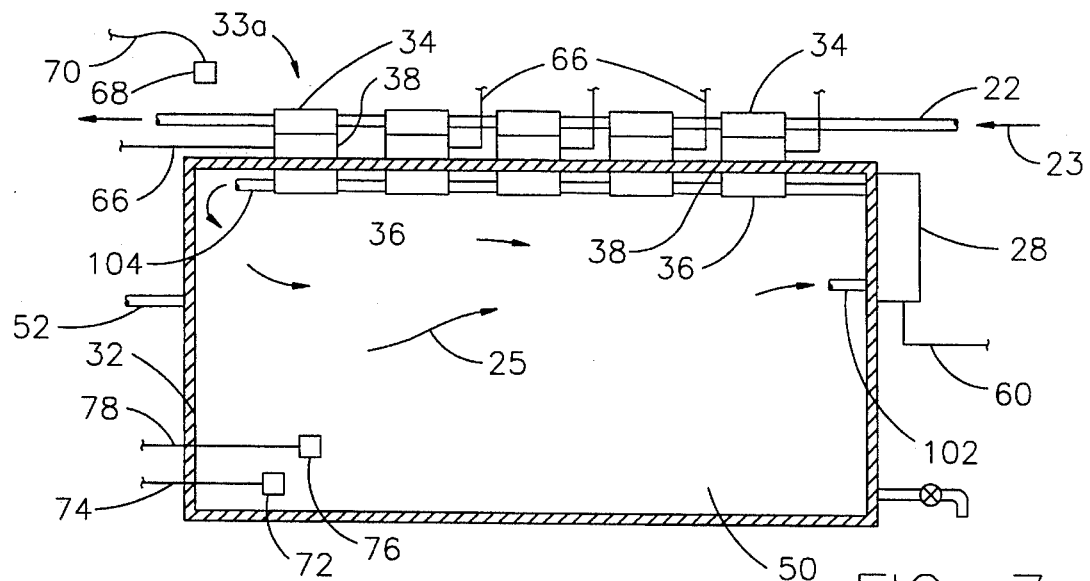
FIG. 7 is a top plan view taken along line 7—7 in FIG. 6 of the cooling water reservoir as shown in FIG. 6.

With reference to FIG. 6, the cool water reservoir 32 retains a quantity of water to be cooled by the heat transfer assembly 33a. As shown in FIGS. 6 and 7, the heat transfer assembly 33a includes the warm water heat transfer sections 34, Peltier devices 38 and the cool water heat transfer sections 36. The cool water heat transfer sections 36 are placed inside the cool water reservoir 32. The components of the heat transfer assembly 33a are sandwiched 34, 38, 36 so as to provide heat transfer from the cool water flow path 25 to the warm water flow path 23. Placement of the cool water heat transfer sections 36 on the inside of the cool water reservoir 32 increase the efficiency of the heat transfer from the cool water in the reservoir to the warm water flow path. Increases in efficiency result from only removing heat from the water in the reservoir and not moving ambient environmental heat. Cool water heat transfer sections 36 positioned outside of the reservoir 32 tend to collect some ambient heat surrounding the reservoir which has to be moved during the heat transfer operation thereby decreasing the efficiency of the heat transfer assembly 33a. In otherwords, positioning the cool water heat transfer sections inside the reservoir limits the heat energy transferred through the cool water heat transfer sections to only heat energy which is removed from the cool water reservoir and not the ambient environment.

Further increases in the efficiency of the system 20A are provided by transporting the warm water flowing in the warm water flow path 23 away from the reservoir 32 to the radiating means 40. Radiating means 40 including the fan 44 are directed away from the reservoir 32 so that heat (100) expelled from the radiator assembly 42 by the fan 44 is directed away from the cool water reservoir 32 thereby preventing reabsorption of heat energy from the waste energy which is removed from the warm water flow path 23. Water is a preferred heat transfer medium for the warm water flow path 23 due to its high specific heat and reasonable thermal conductivity. The water flowing through the warm water flow path 23 is transported to the large area air exchanger or radiator assembly 42 of known construction and the heat is moved by the fan 44 blowing air across the radiator assembly 42. Additionally, efficiency can be increased by using the heat transfer assemblies 33a (as shown in FIGS. 6 and 7) and 33b (see FIGS. 8 and 9) which define generally non-tortuous, generally linear flow paths between the connections of the heat transfer sections. In otherwords, the heat transfer mediums flow through each path 23, 25 only passing at the heat transfer assembly 33a, 33b and therefore minimize the potential for reabsorption. In this way, reabsorption of heat by the cool water reservoir 32 is minimized as the heat is rapidly collected and removed by warm water flow path 23.

Turning now to more specific descriptions of FIGS. 6 and 7. As shown in FIGS. 6 and 7 the heat transfer assembly 33A, having the cool water heat transfer sections 36 mounted inside the cool water reservoir 32 employs the water moving forces of a cool water pump 28 which collects water from the reservoir and drives the water through the cool water heat transfer section 36 positioned inside the reservoir 32. An intake port 102 of the cool water pump 28 is positioned towards the top section 46 of the reservoir so as to collect water which may have accumulated some heat and separated towards the top 46 by natural convection process. This somewhat warmer water is driven by the pump 28 through the cool water heat transfer sections 36. Water having passed through the cool water heat transfer sections 36 is expelled from a discharge port 104 directed downwardly towards a lower section 50 of the reservoir. The cool water will generally be the first water to be dispensed as the outlet 48 is positioned in the lower section 50 of the reservoir 32. Operation of the warm water heat transfer pump 26 and cool water heat transfer pump 28 are controlled by the control circuit 56 over control lines 58, 60, respectively, so as to maximize the heat transfer from the cool water to the warm water.

Figure 8:
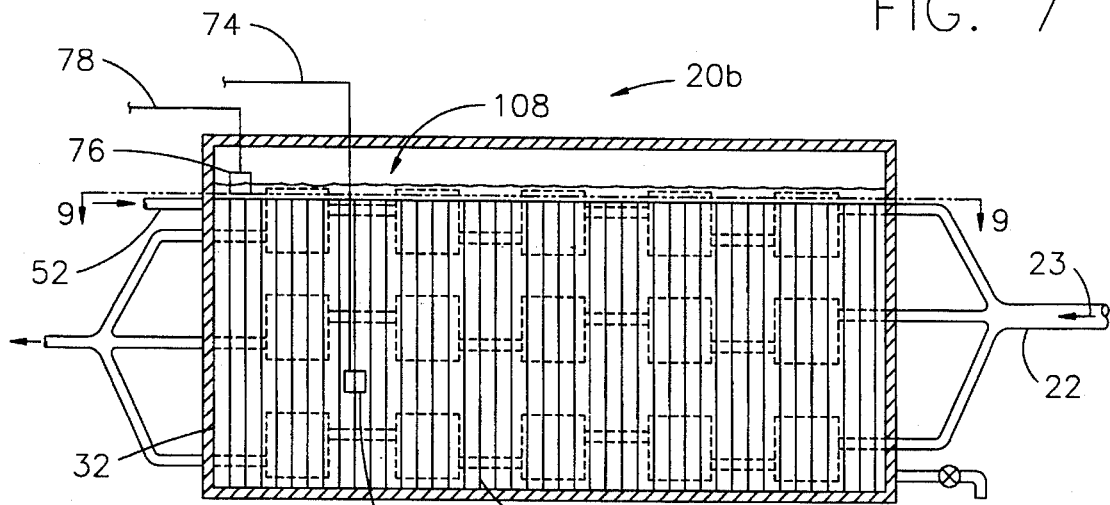
FIG. 8 is a generalized schematic of a second alternate embodiment of a water cooling system of the present invention.
Figure 9:
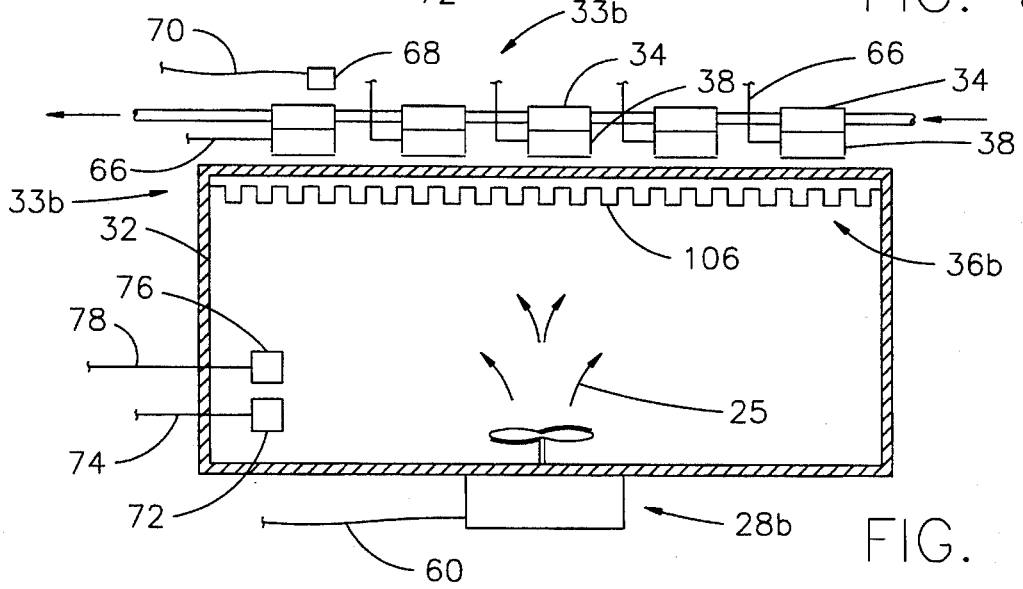
FIG. 9 is a top plan view taken along line 9—9 in FIG. 8 of the cooling water reservoir as shown in FIG. 8.

FIGS. 8 and 9 show a heat transfer assembly 33b which includes heat transfer fins 106 attached to a wall. The heat transfer fins are in close proximity to the cool water heat transfer sections 36 so as to provide an increased surface area for collected heat energy from the water in the reservoir 32. It should be noted that the cool water heat transfer sections 36b do not include a flow path therethrough. The flow path 25 is created by a stirring device or pump 28b which moves the water in the reservoir 32 towards the fins 106. The moving means 28b stirs the water so as to circulate water against the overall surface defined by the fins 106 and thereby increase the heat transfer from the water to the Peltier device 38 positioned against the back surface of the fins 106. The stirring means 28b can be in the form of commercially available device such as a mechanical rotating stirrer blade.

Further efficiencies may be gained by having an array of warm heat transfer sections positioned outside the reservoir. The array of warm water heat transfer sections increases the heat carrying and heat accumulation capacity of the warm water flow 23 through the conduit 22. It should be noted that such an array could be created in any one of the other configurations discussed hereinabove. The array 108 may be particularly useful with the fin arrangement 106 since the fins will generally collect and radiate heat over the entire surface thereof.

FIG. 5 provides an electrical schematic of the water cooling system 20. The electrical schematic can be broken up into several functional portions including a DC power supply portion 100, a fan circuit portion 102, a cooler circuit portion 104, a sensor voltage supply circuit portion 106, a temperature sensor circuit portion 108, a level sensor circuit portion 110, a fill circuit portion 112, and a pump circuit portion 114. The DC power supply circuit portion 100 provides unregulated filtered DC power at about 20 volts DC output to the system. The fan circuit portion 102 operates a fan 44 in response to the temperature sensor circuit portion 108. Similarly, the cooler circuit portion 104 includes Peltier devices 38 connected to electric switches Q2 and Q3. The Peltier devices 3 8 are operated by the switches Q2,Q3 in response to the temperature sensor circuit portion 108. Additionally, components D3, D4, R2, R3, Q2, and Q3 provide an "AND" function which allows the Peltier devices 38 to operate and to cool water if the hot side heat transfer is functioning and the water in the system is too warm. As can be seen by the schematic, this combination of components performing the "AND" function is coupled to the temperature sensor circuit portion 108.

The regulated voltage supply 106 for the temperature sensor circuit portion 108, and the associated components, includes a LM78L12 of known construction which is available from National Semiconductor, Company.

The temperature sensor circuit portion 108 includes semiconductor temperature sensors 116 (shown generally as 68 in FIG. 1) is of known construction, such as a LM335 which is available from National Semiconductor, Company. The temperature sensor circuit portion 108 performs as a comparator capable of indicating whether the temperature sensor input is above or below a set value or small range of values. The comparator function is provided by U1-1, U2, and R16 for the cooled water target temperature. A differential (hysteresis) of about 2° F. is provided by R14 and R15 to prevent rapid on/off cycling of the system. The output from U1-1 drives the switches Q1, Q2, Q3, and Q4 for controlling the fan 44, the Peltier devices 38, and the pumps 26,28. The LM355 devices 116 have a temperature sensitivity of approximately 10 mv/° C. and a nominal output of 2.73 v at 0° C. As the water warms, the voltage across U2 increases and the minus input of U1-1 will become more negative than its plus input which forces the output high. The inverse result occurs as the water cools.

In a similar manner, U1-2 functions like U1-1 but is set at about 130° F. The corresponding sensor 68 is thermally coupled to one of the hot sides of a Peltier device 38 allowing the sensor 68 to sense and indicate an over-temperature condition. Such an over-temperature condition could occur, for example, as a result of pump failure or perhaps a user inadvertently blocking the water flow or the heat exchanger air flow.

The fill circuit portion 112 and the pump circuit portion 114 are derived by the outputs of the level sensor circuit portion 110 and the temperature sensor circuit portion 108, respectively. The level sensor circuit portion 110 is comprised of an AC resistive water level switch shown generally in FIGS. 1 and 5 as level sensor 76. The level sensor 76 includes three probes, a long probe 118, a fill probe 120, and a full probe 122. The full probe 122 is shorter than the fill probe 120 such that when the water level in the reservoir rises to a desired level, the full probe 122 contacts the water level to terminate operation. Similarly, when the water level in the reservoir drops below a desired level, the fill probe 120 is exposed thereby activating the fill level sensor circuit portion 110 to allow more water to flow into the reservoir.

The water level in the reservoir connects the drive to both the fill and full probes 120,122 such that the rectified filter voltage at the U1-3 minus input will be nearly plus 6 v while the plus side will be repeatedly pulled much lower than plus 6 v. The output at U1-4 will then be forced low turning off the fill valve 48. As the water drops below the full probe 122, the drive to the plus input vanishes while R18 and R20 hold the plus input below the minus input. Hence, nothing happens. When the water drops below the fill probe 120, the drive to Q6 vanishes allowing the voltage at U1-4 to decay to a value lower than that previously established at the plus input. The output then goes high turning on the fill valve 48. As the water level water rises, the plus 6 v returns to the minus input. The plus side bias, however, is now above plus 6 v due to the output transfer at U1-4, hence nothing happens until the full probe 122 is reconnected when it is submerged as a result of the rising water level.

While preferred embodiments of the present invention are shown and described, it is envisioned that those skilled in the art may devise various modifications of the present invention without departing from the spirit and scope of the appended claims. For example, rather than cooling the water in the system, the system may be used for heating the water by reversing the direction of current flow in the Peltier devices 38 so that the respective cool sides of these devices are positioned next to the first conduit 22 and the corresponding first transfer sections 34 and its hot side is positioned next to the second conduit 24 and the corresponding second transfer sections 36. In this arrangement, the radiating means 40 is adapted to use ambient air to transfer heat energy into the liquid in the conduit 24 and the sensors and control circuit 56 are adapted to actuate the system to heat the water in the first conduit 22 to a desired elevated temperature which could, for example, be sufficient for brewing coffee, tea, or for other hot food preparation. The invention is not intended to be limited by the foregoing disclosure.

The invention claimed is:

1. A water cooling system for reducing the temperature of potable water to a temperature range of substantially on the order of 35–70 degrees F., said water cooling system comprising:

a cool water reservoir having an outlet for dispensing cooled water and an inlet for receiving water for cooling;

a warm water flow path comprising tube means passing in close proximity to said cool water reservoir;

a warm water pump operatively associated with said warm water flow path for moving warm water along said warm water flow path tube means;

a cool water flow path at least passing through said cool water reservoir;

a cool water pump operatively associated with said cool water flow path for moving cool water along said cool water flow path;

a warm water heat transfer section including a plurality of segments respectively communicating with parallel portions of said warm water flow path tube means, water flowing through said warm water flow path thermally communicating with said warm water heat transfer section segments for removing heat energy therefrom;

a cool water heat transfer section including a plurality of segments positioned in said cool water reservoir and respectively communicating with connected portions of said cool water flow path, all water flowing through said cool water flow path thermally communicating with all said portions of said cool water flow path in said cool water heat transfer section; and a plurality of Peltier heat transfer devices respectively disposed between said warm water heat transfer section segments and said cool water heat transfer section segments for promoting flow of heat energy from said cool water reservoir to said warm water flow path through said cool water heat transfer section segments and said warm water heat transfer section segments.

2. A water cooling system as recited in claim 1, further comprising tube means defining said portions of said cool water flow path within said cool water reservoir, said portions of the cool water flow path being serially connected with each other.

3. A water cooling system as recited in claim 1, wherein said cool water heat transfer is a finned heat transfer element positioned with fins contacting water retained in said cool water reservoir for increasing the heat transfer from the water retained in the cool water reservoir to said finned heat transfer element.

4. A water cooling system as recited in claim 1, wherein said cool water pump is a stirring device disposed in said cool water reservoir for moving water in said cool water reservoir into contact with said cool water heat transfer section.

5. A water cooling system as recited in claim 1, wherein said Peltier heat transfer devices and said warm water heat transfer section are positioned outside of said cool water reservoir, said Peltier heat transfer devices being positioned between said warm water heat transfer section and said cool water heat transfer segments inside of said cool water reservoir.

6. A water cooling system as recited in claim 1, further comprising: a control circuit, said Peltier devices being coupled to said control circuit and said control circuit operating said Peltier devices in response to a prespecified control signal.

7. A water cooling system as recited in claim 6, further comprising a transfer section temperature sensor operatively associated with said warm water heat transfer section and coupled to said control circuit, said transfer section temperature sensor sensing the temperature of a said heat transfer section, said control circuit suspending operation of said system when said transfer section temperature sensor senses a temperature at the corresponding warm water heat transfer section in excess of a selected temperature value.

8. A water cooling system as recited in claim 6, further comprising a reservoir temperature sensor operatively associated with said cool water reservoir and coupled to said control circuit, said warm water pump and said cool water pump being operatively associated with said control circuit, said control circuit being responsive to said reservoir temperature sensor for activating said warm water and cool water pumps when said reservoir temperature sensor senses a temperature which is above a prespecified temperature value.

9. A water cooling system as recited in claim 6, further comprising a water level sensor operatively associated with said cool water reservoir and coupled to said control circuit, said water level sensor sensing said control circuit activating said controllable inlet valve to allow water to flow through said water inlet when said water level sensor senses a predetermined low water condition.

10. A water cooling system as recited in claim 1, wherein said warm water flow path passing through said warm water heat transfer section and said cool water flow path passing through said cool water heat transfer section define respective tortuous channels in said respective heat transfer sections, said respective tortuous channels increasing the heat transfer capacity of said respective heat transfer sections.

11. A water cooling system as recited in claim 1, further comprising a warm water reservoir disposed in said warm water flow path, means for radiating heat operatively associated with said warm water flow path, said radiating means radiating heat energy collected by said warm water flow path passing through said warm water heat transfer sections, water passing from said radiating means being deposited in said warm water reservoir.

12. A system for adjusting and controlling the temperature of dispensable water comprising:

a first circuitous closed circuit conduit defining a first water flow path having a plurality of serially connected segments and including a controllable water inlet valve and a dispensing valve, a second circuitous closed circuit conduit defining a second water flow path having a plurality of parallel segments, said conduit segments respectively including a first heat transfer section and a second heat transfer section, a plurality of Peltier devices respectively disposed between and in heat transfer relationship with said first and second heat transfer sections for cooling one of said sections and heating the other of said sections, means connected with each of said conduits for circulating the liquid therein, and heat exchange means associated with said second conduit for transferring heat between said second conduit and ambient atmosphere.

13. A system as recited in claim 12, wherein said Peltier devices are arranged for cooling the water in said first conduit.

14. A system as recited in claim 12, wherein said Peltier devices are arranged for heating the water in said first conduit.

* * * * *

UNITED STATES PATENT AND TRADEMARK OFFICE
CERTIFICATE OF CORRECTION

PATENT NO.  : 5,590,532
DATED       : January 7, 1997
INVENTOR(S) : Wesley J. Bachman It is certified that error appears in the above-indentified patent and that said Letters Patent is hereby corrected as shown below:

Column 9, Line 34 "transfer is" should be --transfer section is --

Signed and Sealed this

Fifteenth Day of April, 1997

Attest:

BRUCE LEHMAN

*Attesting Officer*   *Commissioner of Patents and Trademarks*